United States Patent
Shibata

(10) Patent No.: US 7,622,791 B2
(45) Date of Patent: Nov. 24, 2009

(54) III-V GROUP NITRIDE SYSTEM SEMICONDUCTOR SUBSTRATE

(75) Inventor: Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 53 days.

(21) Appl. No.: 11/892,382

(22) Filed: Aug. 22, 2007

(65) Prior Publication Data

US 2008/0001174 A1 Jan. 3, 2008

Related U.S. Application Data

(62) Division of application No. 10/928,482, filed on Aug. 30, 2004, now Pat. No. 7,276,779.

(30) Foreign Application Priority Data

| Nov. 4, 2003 | (JP) | ............................. 2003-374361 |
| Apr. 30, 2004 | (JP) | ............................. 2004-135534 |

(51) Int. Cl.
  *H01L 29/04* (2006.01)
  *H01L 29/20* (2006.01)
  *H01L 21/20* (2006.01)
(52) U.S. Cl. ............... 257/615; 257/628; 257/E29.004; 257/E29.091; 438/483; 438/977
(58) Field of Classification Search .................. 257/628
  See application file for complete search history.

(56) References Cited

U.S. PATENT DOCUMENTS

| 6,252,255 B1 | 6/2001 | Ueta et al. |
| 6,413,627 B1 | 7/2002 | Motoki et al. |
| 6,488,767 B1 | 12/2002 | Xu et al. |
| 6,518,602 B1 | 2/2003 | Yuasa et al. |
| 6,734,530 B2 * | 5/2004 | Ban ........................... 257/628 |
| 6,924,159 B2 | 8/2005 | Usui et al. |
| 7,097,920 B2 | 8/2006 | Usui et al. |
| 7,221,037 B2 * | 5/2007 | Kitaoka et al. .............. 257/615 |

(Continued)

FOREIGN PATENT DOCUMENTS

JP            04-297023           10/1992

(Continued)

OTHER PUBLICATIONS

Phys.stat.sol. (a) 176,285 (1999) pp. 285-290, Christiansen et al., "Relaxation Processes of AlGaN / GaN Heterostructures Grown onto Single Crytsal GaN (0001) Substrates".

(Continued)

*Primary Examiner*—Stephen W Smoot
(74) *Attorney, Agent, or Firm*—McGinn IP Law Group, PLLC

(57) ABSTRACT

A III-V group nitride system semiconductor substrate is of a III-V group nitride system single crystal. The III-V group nitride system semiconductor substrate has a flat surface, and a vector made by projecting on a surface of the substrate a normal vector of a low index surface closest to the substrate surface at an arbitrary point in a plane of the substrate is converged on a specific point or a specific region inside or outside the plane of the substrate.

12 Claims, 5 Drawing Sheets

U.S. PATENT DOCUMENTS

| | | |
|---|---|---|
| 7,229,926 B2 | 6/2007 | Matsumoto |
| 2001/0048114 A1 | 12/2001 | Morita et al. |
| 2003/0033974 A1 | 2/2003 | Ueda |
| 2005/0026398 A1* | 2/2005 | Nakamura .................. 438/479 |

FOREIGN PATENT DOCUMENTS

| | | |
|---|---|---|
| JP | 10-312971 | 11/1998 |
| JP | 11-251253 | 9/1999 |
| JP | 2000-22212 | 1/2000 |
| JP | 2000-82676 | 3/2000 |
| JP | 2001-77476 | 3/2001 |
| JP | 2003-165799 | 6/2003 |
| JP | 2003-178984 | 6/2003 |
| JP | 2003-277195 | 10/2003 |
| JP | 2005-136167 | 5/2005 |

OTHER PUBLICATIONS

Journal of Crystal Growth 226(2001) 73-78 pp. 73-78, Yang et al., A selective growth of III-nitride by MOCVD for a buried-ridge type structure.

Electrochemical and Solid-State Letters, 5 (8) G61-G64 (2002) pp. G61-G64, Tavernier et al., "Chemical Mechanical Polishing of GalliumNitride".

Petition for Submitting The Publications dated Jan. 22, 2008, with English-Language translation.

Ok-Hyun Nam, et al., "Lateral epitaxy of low defect density GaN Layers via organometallic vapor phase epitaxy". Appl. Phys. Lett. 71, Nov. 3, 1997, pp. 2638-2640.

Masaru Kuramoto, et al., "Room-Temperature Continuous-Wave Operation of InGaN Multi-Quantum-Well Laser Diodes Grown on an n-GaN Substrate with a Backside n-Contact", Japanese Journal Applied Physics, vol. 38, Part 2, No. 2B, Feb. 15, 1999, pp. L184-L186.

Tsvetanka S. Zheleva, et al., "Pendeo-Epitaxy—A New Approach for Lateral Growth of Gallium Nitride Structures", Cite this article as: MRS Internet J. Nitride Semicond. Res. 4S1, G3.38 (1999).

Yuichi Oshima, et al., "Preparation of Freestanding GaN Wafers by Hydride Vapor Phase Epitaxy with Void-Assisted Separation", Japanese Journal Applied Physics, vol. 42, Part 2, No. 1A/B, Jan. 15, 2003, pp. L1-L3.

Kensaku Motoki, et al., "Preparation of Large Freestanding GaN Substrate by Hydride Vapor Phase Epitaxy Using GaAs as a Starting Substrate". Japanese Journal Applied Physics, vol. 40, Part 2, No. 2B, Feb. 15, 2001, pp. L140-L143.

* cited by examiner

21 GaN SUBSTRATE
22 LINE 21
24 CONVERGENCE CENTER REGION
23 ARROW ent semiconductor substrate, a method of making the same, a
III-V GROUP NITRIDE SYSTEM SEMICONDUCTOR SUBSTRATE The present Application is a Divisional Application of U.S. patent application Ser. No. 10/928,482 filed on Aug. 30, 2004, now U.S. Pat. No. 7,276,779, issued on Oct. 2, 2007.

BACKGROUND OF THE INVENTION

1. Field of the Invention

The present invention relates to a III-V group nitride system semiconductor substrate, a method of making the same, a III-V group nitride system semiconductor device, and a lot of III-V group nitride system semiconductor substrate.

2. Description of the Related Art

Nitride system semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be used for short-wavelength light emitting device. Further, they have a high saturation drift velocity of electron and can use two-dimensional carrier gases in hetero junction. Therefore, they are also expected to be used for electronic device.

With silicon (Si) or gallium arsenide (GaAs) which is already in popular use, an epitaxial growth layer of silicon (Si) or gallium arsenide (GaAs) to compose a device is homo-epitaxially grown on Si substrate or GaAs substrate of same kind of material. In the homo-epitaxial growth on homo-substrate, the crystal growth proceeds in step flow mode and epitaxially grown surface while generating little crystal defect.

On the other hand, it is difficult to grow a bulk crystal of nitride system semiconductor, and a GaN self-standing substrate for practical use is just developed. At present, a widely used substrate for epitaxial growth GaN is sapphire. The process of growing a nitride system semiconductor epitaxial layer to compose a device is generally conducted as follows. At first, a GaN layer is hetero-epitaxially grown on single-crystal sapphire by using vapor-phase growth such as MOVPE (metal organic vapor phase epitaxy), MBE (molecular beam epitaxy) and HVPE (hydride vapor phase epitaxy). Then, the nitride system semiconductor epitaxial layer is grown on the GaN layer sequentially or in another growth vessel.

Since the sapphire substrate has a lattice constant different from that of GaN, single-crystal film of GaN cannot be obtained by growing GaN directly at a high temperature on the sapphire substrate. Thus, a method is invented that AlN or GaN buffer layer is in advance grown on the sapphire substrate at a low temperature of 500° C. or so, thereby reducing the lattice strain, and then GaN is grown on the buffer layer (e.g., Japanese patent application laid-open No. 4-297023). With such a low temperature growth buffer layer, it becomes possible to obtain single-crystal epitaxially grown GaN. However, even in this method, the lattice mismatch between the sapphire substrate and the grown crystal is not eliminated and, at the initial step of growth, the crystal growth proceeds in three-dimensional island growth mode (Volmer-Waber growth mode), not in step flow mode (Stranski-krastanov growth mode) aforementioned. Therefore, GaN thus obtained has a dislocation density as much as $10^9$ to $10^{10}$ cm$^{-2}$. Such a defect causes a problem in fabricating GaN system device, especially LD or ultraviolet emission LED.

In recent years, ELO (e.g., Appl. Phys. Lett. 71 (18) 2638 (1997)), FIELO (e.g., Jpn. J. Appl. Phys. 38, L184 (1999)) and pendeoepitaxy (e.g., MRS Internet J. Nitride Semicond. Res. 4S1, G3.38 (1999)) are reported that are methods for reducing a defect density generated due to the lattice mismatch between sapphire and GaN. In these methods, a SiO$_2$ patterning mask etc. is formed on GaN grown on a sapphire substrate, and then GaN is selectively grown from the mask window. Thereby, the propagation of dislocation from underlying crystal can be suppressed. Due to such a growth method, the dislocation density in GaN can be significantly reduced to a level of $10^7$ cm$^{-2}$ or so. For example, Japanese patent application lain-open No. 10-312971 discloses such a method.

Further, various methods of making a self-standing GaN substrate are suggested that a thick GaN layer with reduced dislocation density is epitaxially grown on a hetero-substrate such as sapphire and then the GaN layer grown is separated from the underlying substrate (e.g., Japanese patent application laid-open No. 2000-22212). For example, Japanese patent application laid-open No. 11-251253 discloses a method of making a self-standing GaN substrate that a GaN layer is grown on a sapphire substrate by ELO and then the sapphire substrate is removed by etching. Other than this, VAS (Void-Assisted Separation: e.g., Y. Oshima et al., Jpn. J. Appl. Phys. Vol. 42 (2003) pp. L1-L3, Japanese patent application laid-open No. 2003-178984) and DEEP (Dislocation Elimination by the Epi-growth with inverted-Pyramidal pits: e.g., K. Motoki et al., Jpn. J. Appl. Phys. Vol. 40 (2001) pp. L140-L143, Japanese patent application laid-open No. 2003-165799) are known. The VAS is conducted such that GaN is grown through TiN thin film with a mesh structure on substrate such as sapphire while providing voids at the interface of underlying substrate and GaN layer, thereby allowing both the separation and the dislocation reduction of GaN substrate. The DEEP is conducted such that GaN is grown on a GaAs substrate, which is removable by etching, by using a SiN patterning mask while intentionally forming pits surrounded by facets on the surface of crystal, accumulating dislocations at the bottom of pits to allow regions other than pits to have a low dislocation density.

However, the conventional methods of making GaN substrate have next problems.

As described above, a GaN crystal to compose a GaN self-standing substrate is at least once hetero-epitaxially grown on the hetero-substrate such as sapphire and GaAs with a considerably different lattice constant. The GaN crystal grown on the hetero-substrate is subjected to a bowing caused by a difference in lattice constant or linear expansion coefficient between the GaN crystal and the underlying hetero-substrate. It is known that such a bowing is significantly observed even in a self-standing substrate after removing the underlying substrate. In some cases, such a bowing may be generated already during the crystal growth, where the crystal continues growing while being kept bowed. In the other cases, a crystal may grow while retaining such a strain inside thereof and the bowing may be generated after removing the underlying substrate. For example, Japanese patent application laid-open No. 2000-22212 discloses an example that a convex-upward bowing is generated in a GaN self-standing substrate manufactured using a GaAs substrate as underlying substrate (FIGS. 11 and 15 ibid.).

When the GaN substrate is bowed, the crystal axis thereof also has an in-plane distribution according to the bowing. This is also indicated in FIG. 15 of Japanese patent application laid-open No. 2000-22212.

GaN self-standing substrates are frequently marketed in the form of having its surface mirror-finished by polishing as in other semiconductor substrates. Therefore, although they may appear to be flat, a distribution in inclination of crystal axis may be generated due to the bowing of the original GaN substrate before the polishing.

This situation will be explained below with reference to drawings.

FIG. 1 is an illustrative cross sectional view showing the definition of parameters to represent an inclination direction of crystal axis. Provided that, at an arbitrary point A, a low index surface 15 closest to a substrate surface 14 has an inclination to the substrate surface 14, the inclination of crystal axis can be known by finding what direction and how much the normal vector 16 of the low index surface 15 closest to the substrate surface 14 is inclined from the normal line of the substrate surface 14. This can be easily known by X-ray diffraction measurement. What direction the original substrate before the polishing is bowed can be known by finding what direction in the plane of substrate a vector 17 heads in that is made by projecting on the substrate surface 14 the normal vector 16 of the low index surface 15 closest to the substrate surface 14.

FIG. 2 is an illustrative cross sectional view showing a distribution in inclination of crystal axis inside a conventional GaN substrate with a surface that, though it was originally convex-bowed, is flattened by polishing. FIG. 3 is an illustrative top view showing an in-plane distribution of a vector made by projecting on the substrate surface the normal vector of a low index surface closest to the substrate surface in order to show a distribution in inclination of crystal axis viewed from the substrate surface with respect to the conventional GaN substrate with a surface that, though it was originally convex-bowed, is flattened by polishing.

When the original substrate before the polishing is convex upward-bowed to the surface, the crystal axis has a distribution spread on the surface side inside the substrate as shown in FIG. 2 even in a substrate 18 with the surface flattened by polishing. Lines 19 depicted inside the substrate 18 indicate the direction of crystal axis (normal line of low index surface closest to the substrate surface). The substrate 18 has such a distribution that a vector made by projecting on the substrate surface the abovementioned normal vector of low index surface closest to the substrate surface is, as shown by arrows 20 in FIG. 3, radiated to the outside of the substrate 18.

If an epitaxial layer of AlGaN mixed crystal is grown on a GaN substrate with such a distribution in inclination of crystal axis, there occurs a large dispersion in morphology or crack generation of the AlGaN mixed crystal. Thus, the reliability of epitaxial layer grown on the GaN substrate is low. The same tendency is found even when using a GaN layer that is once homo-epitaxially grown on the GaN substrate. This problem is not found in the other semiconductor materials such as Si and GaAs. In other words, it is a unique problem on III-V group nitride system semiconductor layers that are grown using a thick-film substrate that is hetero-epitaxially grown on the hetero-substrate.

SUMMARY OF THE INVENTION

It is an object of the invention to provide a III-V group nitride system semiconductor substrate that allows a nitride system crystal with a good crystalline quality to be epitaxially grown with a high reliability.

It is a further object of the invention to provide a method of making a III-V group nitride system semiconductor substrate as mentioned above.

It is a further object of the invention to provide a III-V group nitride system semiconductor device grown on the substrate as mentioned above.

It is an object of the invention to provide a lot of III-V group nitride system semiconductor substrate as mentioned above.

According to first aspect of the invention, a III-V group nitride system semiconductor substrate comprises:

a III-V group nitride system single crystal, wherein: the III-V group nitride system semiconductor substrate comprises a flat surface; and a vector made by projecting on a surface of the substrate a normal vector of a low index surface closest to the substrate surface at an arbitrary point in a plane of the substrate is converged on a specific point or a specific region inside the plane of the substrate.

According to second aspect of the invention, a III-V group nitride system semiconductor substrate comprises:

a III-V group nitride system single crystal, wherein: the III-V group nitride system semiconductor substrate comprises a flat surface; and a vector made by projecting on a surface of the substrate a normal vector of a low index surface closest to the substrate surface at an arbitrary point in a plane of the substrate is converged on a specific point or a specific region outside the plane of the substrate.

The substrate may be a self-standing substrate consisting of the III-V group nitride system single crystal.

The III-V group nitride system single crystal is preferably of hexagonal system. The low index surface is preferably a C-face, and the low index surface is further preferably a III-group C-face.

The III-V group nitride system single crystal may be of hexagonal system and the low index surface is an A-face, M-face or R-face.

The substrate preferably has a surface mirror-finished by polishing.

According to third aspect of the invention, a method of making the III-V group nitride system semiconductor substrate comprises the steps of:

hetero-epitaxially growing the III-V group nitride system single crystal on a hetero-substrate; and subsequently removing the hetero-substrate to obtain the III-V group nitride system semiconductor substrate.

According to fourth aspect of the invention, a method of making the III-V group nitride system semiconductor substrate comprises the steps of:

polishing an upper surface of a substrate, the upper surface being of a III-V group nitride system single crystal and being concave upward-bowed, thereby obtaining the III-V group nitride system semiconductor substrate.

According to fifth aspect of the invention, a III-V group nitride system semiconductor substrate comprises:

the III-V group nitride system semiconductor substrate; and a crystal layer that is formed on the III-V group nitride system semiconductor substrate, and comprises a layer represented by $Al_xGa_{1-x}N$ ($0<x\leqq1$).

According to sixth aspect of the invention, a III-V group nitride system semiconductor device comprises:

the III-V group nitride system semiconductor substrate; and a plurality of crystal layers that are formed on the III-V group nitride system semiconductor substrate, and comprise a layer represented by $Al_xGa_{1-x}N$ ($0<x\leqq1$).

According to seventh aspect of the invention, a lot of III-V group nitride system semiconductor substrate comprises a plurality of the III-V group nitride system semiconductor substrates.

ADVANTAGES OF THE INVENTION

With the III-V group nitride system semiconductor substrate of this invention, even when there is a variation in inclination of crystal axis as a problem specific to III-V group nitride system semiconductor substrate, surface roughness or crack generation, which affects the device fabrication, in nitride system crystal layer, especially AlGaN mixed crystal layer, epitaxially grown on the substrate can be prevented.

As a result, the III-V group nitride system semiconductor substrate of this invention allows a light emitting device or electronic device to have properties as designed initially. Furthermore, the product yield in epitaxial growth process or device fabrication process can be enhanced thereby.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 4:
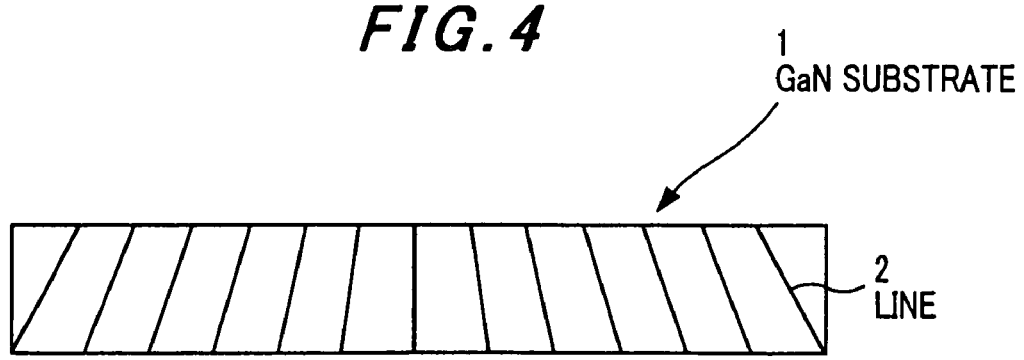
FIG. 4 is a schematic cross sectional view showing a distribution in inclination of crystal axis of a GaN substrate in a first preferred embodiment of the invention, which has a surface that, though it was originally concave-bowed, is flattened by polishing.
Figure 5:
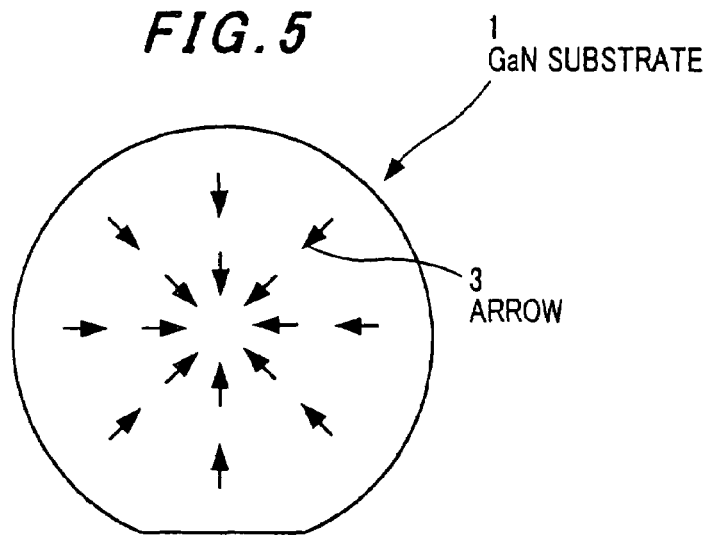
FIG. 5 is an illustrative top view showing an in-plane distribution of a vector made by projecting on the substrate surface the normal vector of a low index surface closest to the substrate surface in order to show a distribution in inclination of crystal axis viewed from the substrate surface with respect to the GaN substrate in the first embodiment of the invention, which has the surface that, though it was originally concave-bowed, is flattened by polishing.

With reference to FIGS. 4 and 5, a III-V group nitride system semiconductor substrate in the first preferred embodiment of the invention will be explained below.

FIG. 4 is a schematic cross sectional view showing a distribution in inclination of crystal axis of a GaN substrate in the first preferred embodiment of the invention, which has a surface that, though it was originally concave-bowed, is flattened by polishing.

FIG. 5 is an illustrative top view showing an in-plane distribution of a vector made by projecting on the substrate surface the normal vector of a low index surface closest to the substrate surface in order to show a distribution in inclination of crystal axis viewed from the substrate surface with respect to the GaN substrate in the first embodiment of the invention, which has the surface that, though it was originally concave-bowed, is flattened by polishing.

As shown in FIG. 4, the crystal axis of GaN substrate 1 is distributed inside the substrate such that it is converged on the surface side after the polishing when the original GaN substrate before the polishing is concave upward-bowed to the surface. Lines 2 depicted inside the substrate 1 indicate the direction of crystal axis. In the GaN substrate 1, the above-mentioned vector made by projecting on the substrate surface the normal vector of a low index surface closest to the substrate surface is, as shown by arrows 3 in FIG. 5, distributed such that it is converged on a specific region inside the GaN substrate 1.

Figure 1:
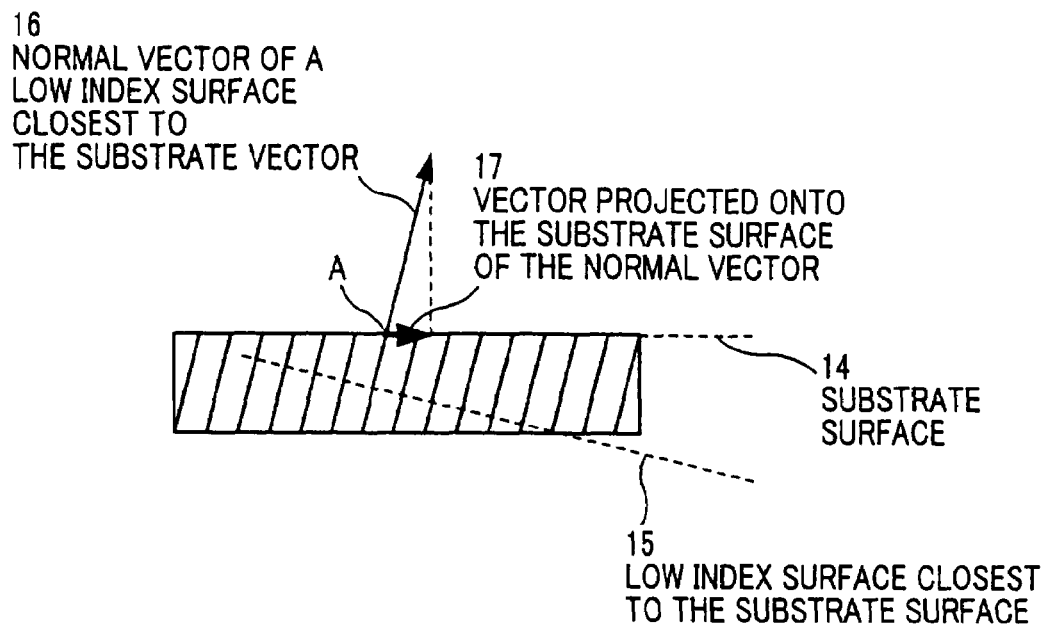
FIG. 1 is an illustrative cross sectional view showing the definition of parameters to represent an inclination direction of crystal axis.
Figure 2:
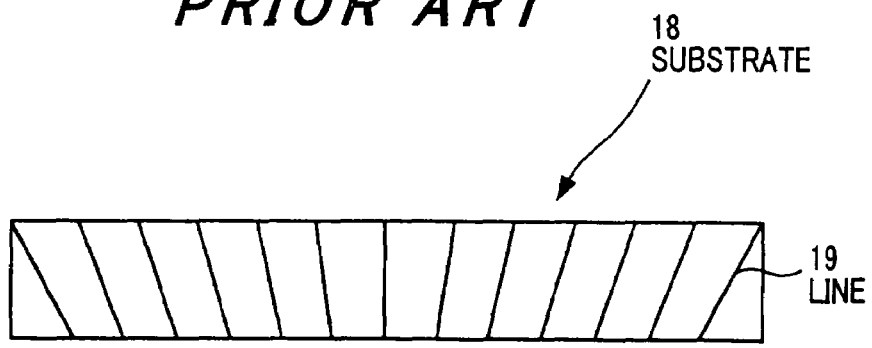
FIG. 2 is an illustrative cross sectional view showing a distribution in inclination of crystal axis of a conventional GaN substrate with a surface that, though it was originally convex-bowed, is flattened by polishing.
Figure 3:
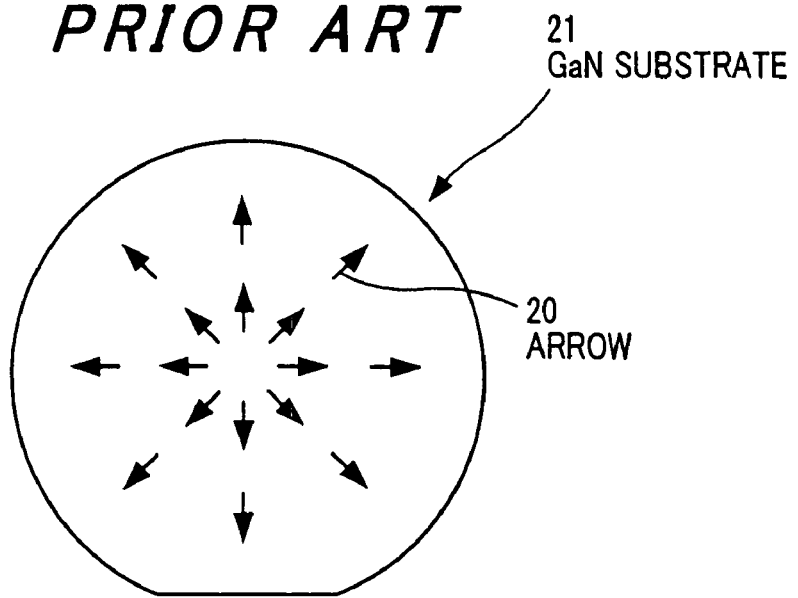
FIG. 3 is an illustrative top view showing an in-plane distribution of a vector made by projecting on the substrate surface the normal vector of a low index surface closest to the substrate surface in order to show a distribution in inclination of crystal axis viewed from the substrate surface with respect to the conventional GaN substrate with a surface that, though it was originally convex-bowed, is flattened by polishing.

The inventor conducts such a research that self-standing GaN substrates with two kinds of distributions in inclination of crystal axis as shown in FIG. 3 and FIG. 5 are manufactured, 0.2 μm thick $Al_{0.1}GaN$ epitaxial layer is grown thereon by MOVPE at normal pressures, and then it is tested whether the surface morphology depends on the distribution in inclination of crystal axis inside the GaN substrate. As a result, it is found that, in the case of the GaN substrate as shown in FIG. 3 where the inclination of crystal axis is distributed radiated toward the outside of the substrate, a crack is likely to occur in the $Al_{0.1}GaN$ epitaxial layer grown thereon and its surface roughness measured averagely tends to be increased and to be not uniform. In contrast, it is found that, in the case of the GaN substrate as shown in FIG. 2 where the inclination of crystal axis is converged inside the substrate, a crack is not likely to occur in the $Al_{0.1}GaN$ epitaxial layer grown thereon and its surface roughness measured tends to be reduced.

Figure 6:
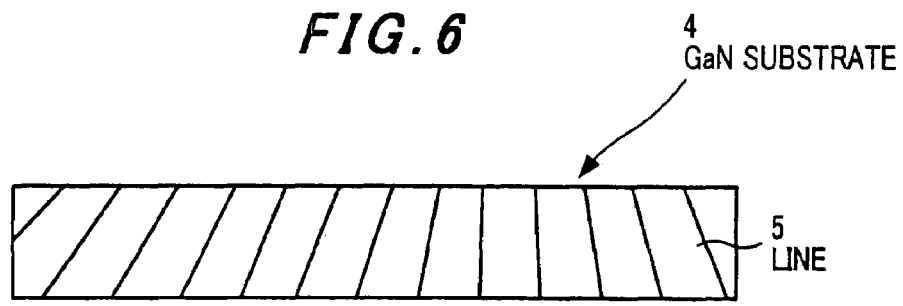
FIG. 6 is a schematic cross sectional view showing a distribution in inclination of crystal axis of a GaN substrate in a second preferred embodiment of the invention, the inclination of crystal axis being converged on a specific point or a specific region with a certain area inside the substrate.
Figure 7:
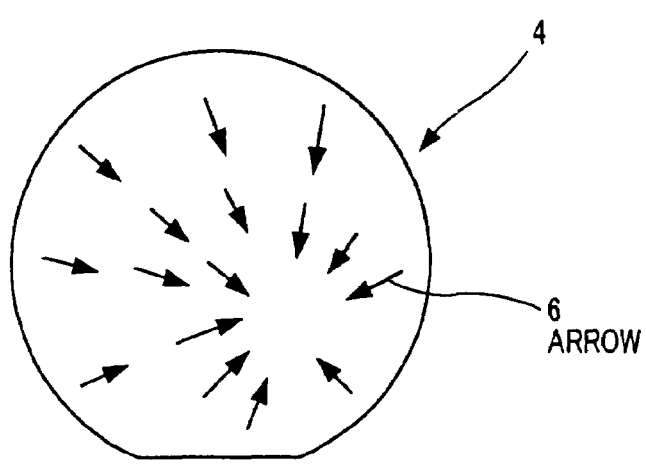
FIG. 7 is an illustrative top view showing an in-plane distribution of a vector made by projecting on the substrate surface the normal vector of a low index surface closest to the substrate surface in order to show a distribution in inclination of crystal axis viewed from the substrate surface with respect to the GaN substrate in the second embodiment of the invention, the inclination of crystal axis being converged on a specific point or a specific region with a certain area inside the substrate.

FIG. 6 is a schematic cross sectional view showing a distribution in inclination of crystal axis of a GaN substrate in the second preferred embodiment of the invention, the inclination of crystal axis being converged on a specific point or a specific region with a certain area inside the substrate as shown in FIG. 7. In FIG. 6, lines 5 depicted inside the substrate 4 indicate the direction of crystal axis.

FIG. 7 is an illustrative top view showing an in-plane distribution of a vector made by projecting on the substrate surface the normal vector of a low index surface closest to the substrate surface in order to show a distribution in inclination of crystal axis viewed from the substrate surface with respect to the GaN substrate in the second embodiment of the invention. In FIG. 7, arrows 6 indicate the vector made by projecting on the substrate surface the normal vector of the low index surface closest to the substrate surface.

It is further found that, even in the case of the GaN substrate as shown in FIG. 7 where the inclination of crystal axis is converged on a specific point or a specific region with a certain area inside the substrate other than the case as shown in FIG. 5 that the inclination of crystal axis is converged on a point at the center of the substrate, a crack is not likely to occur in the $Al_{0.1}GaN$ epitaxial layer grown thereon and its surface roughness measured tends to be reduced.

Figure 8:
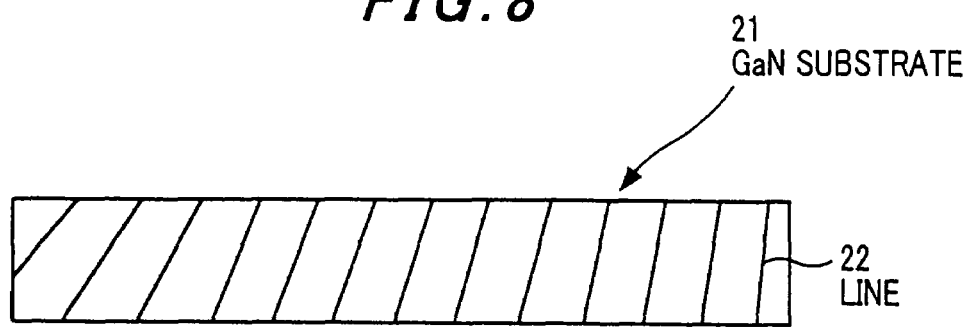
FIG. 8 is a schematic cross sectional view showing a distribution in inclination of crystal axis of a GaN substrate in a third preferred embodiment of the invention, the inclination of crystal axis being converged on a specific point or a specific region with a certain area outside the substrate.

FIG. 8 is a schematic cross sectional view showing a distribution in inclination of crystal axis of a GaN substrate in the third preferred embodiment of the invention, the inclination of crystal axis being converged on a specific point or a specific region with a certain area outside the substrate. In FIG. 8, lines 22 depicted inside the GaN substrate 21 indicate the direction of crystal axis.

Figure 9:
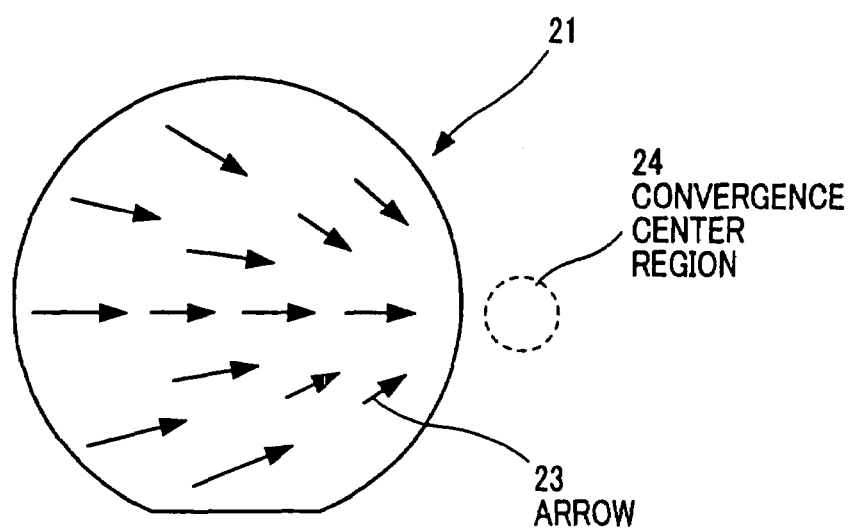
FIG. 9 is an illustrative top view showing an in-plane distribution of a vector made by projecting on the substrate surface the normal vector of a low index surface closest to the substrate surface in order to show a distribution in inclination of crystal axis viewed from the substrate surface with respect to the GaN substrate in the third embodiment of the invention, the inclination of crystal axis being converged on a specific point or a specific region with a certain area outside the substrate, where a circle with dotted line virtually indicates the specific region as a convergence center region on which the projected vectors are converged.

FIG. 9 is an illustrative top view showing an in-plane distribution of a vector (shown by arrows 23) made by projecting on the substrate surface the normal vector of a low index surface closest to the substrate surface in order to show a distribution in inclination of crystal axis viewed from the substrate surface with respect to the GaN substrate 21 in the third embodiment of the invention. In FIG. 9, a circle with dotted line virtually indicates the specific region as a convergence center region 24 on which the projected vectors are converged.

It is further found that, in the case of a GaN substrate with an off-orientation, a vector made by projecting the normal vector on its substrate surface may be distributed such that, as shown in FIG. 9, it is converged on a specific point or a specific region with a certain area outside the substrate, and, even in this case, the same effects can be obtained as in the case that the projected vector is converged on the specific point or the specific region with a certain area inside the substrate.

It is desirable that the specific point or the specific region with a certain area where the projected vector is converged is located outside the substrate rather than inside the substrate surface. Further, in the case of being located outside the substrate, the specific point or region is preferably located distant from the substrate as far as possible. According as the specific point or region is located distant therefrom, dispersion in direction of the projected vector is reduced such that it comes close to a substrate with an ideally uniform distribution in crystal orientation. However, in fact, in using the conventional method of separating a thick-film epitaxial layer from the underlying substrate, the bowing of substrate is generated to some extent. Therefore, it is difficult to obtain a substrate with an ideally uniform distribution in crystal orientation. Accordingly, the substrate of the invention can be advantageous as it is an effective solution to be realized by using the conventional technique.

In theory, by providing a substrate with an off-orientation much greater than an inclination of crystal orientation caused by the bowing of substrate, the specific point or region where the projected vector is converged can be located outside the substrate. However, with a too big off-orientation, it is difficult to grow an epitaxial layer on the substrate and it is difficult to conduct the processing in fabricating a device. Therefore, it is preferable that the off-orientation applied to the substrate is 20 degrees or less.

When a GaN system layer is epitaxially grown on a GaN substrate, a linear morphology is frequently generated on the epitaxial surface. Such a morphology tends to be generated along the crystal orientation of underlying layer, and therefore, when the specific point or region where the projected vector is converged is located inside the substrate, a morphology may be generated that is formed symmetrical around the convergence point while being influenced by the six fold symmetry of crystal. In this case, the crystal may be raised at the intersection of linear morphologies with different directions. This may cause, in a subsequent process, such a problem that the accuracy of photolithography is reduced. However, when the convergence point is located outside the substrate, the direction of projected vectors comes to be parallel in the plane of substrate and the projected vectors are not in point symmetry distribution. Therefore, a frequency that the linear morphologies intersect each other can be reduced.

Herein, a specific region means the vicinity of a specific point and is formed nearly circular.

According to the invention is provided a III-V group nitride system semiconductor substrate characterized in that an in-plane distribution in inclination direction of crystal axis to be nearly perpendicular to the crystal surface, i.e., a vector made by projecting on the substrate surface the normal vector of a low index surface closest to the substrate surface at an arbitrary point in the substrate plane is converged on a specific point or region inside or outside the substrate plane. Further provided are an epitaxial wafer with an AlGaN system epitaxial growth layer grown on the substrate, and a III-V group nitride system semiconductor device to be fabricated by cutting the epitaxial wafer into chips by dicing etc.

Herein, a self-standing substrate means a substrate that can hold its shape by itself and has a sufficient strength for handling. To provide such a strength, the thickness of self-standing substrate is preferably 200 μm or more. In view of mass production of the devices, it is preferable that the III-V group nitride system semiconductor substrate has a size of 2 inches in diameter or more. With respect to the crystalline quality of III-V group nitride system semiconductor substrate, it is preferable that the double-crystal XRD rocking curve FWHM is 250 seconds or less.

A III-V group nitride system semiconductor according to the invention is represented by $In_xGa_yAl_{1-x-y}N$ ($0 \leq x \leq 1$, $0 \leq y \leq 1$, $0 \leq x+y \leq 1$). Especially, GaN, AlN and AlGaN are preferably used. This is because they satisfy properties required to a substrate material such as strength and stability in manufacture.

A III-V group nitride system semiconductor substrate according to the invention may be a hetero-epitaxial wafer with a hetero-substrate as the underlying layer. However, it is desirably a self-standing substrate composed of only a III-V group nitride system crystal. If it is provided with a hetero-substrate as the underlying layer, when heating the substrate in the epitaxial growth, the bowing condition may be significantly changed as compared to that at room temperature due to a difference in linear expansion coefficient between the underlying substrate crystal and the III-V group nitride system semiconductor crystal. As a result, the distribution of inclination orientation of crystal axis, which is a key point of the invention, may be changed. Thus, it is desirable that it is not provided with a hetero-substrate as the underlying layer.

A III-V group nitride system semiconductor substrate according to the invention is desirably of hexagonal system crystal. This is because the hexagonal system III-V group nitride system semiconductor crystal is more stable than cubic system crystal, and it allows an epitaxial layer of III-V group nitride system semiconductor crystal with a high crystalline quality to be formed thick, thereby increasing the degree of freedom in fabricating a device. Alternatively, the substrate may be of cubic system crystal.

A III-V group nitride system semiconductor substrate according to the invention is desirably provided with a hexagonal system C-face on a low index surface closest to the substrate surface. This is because the III-V group nitride system semiconductor crystal inherently has a strong c-axis orientation, and the hexagonal system c-face allows a high crystalline quality growth in growing the substrate crystal or in growing a III-V group nitride system semiconductor crystal on the substrate according to the invention. Alternatively, it may be provided with A-face, M-face or R-face other than C-face.

A III-V group nitride system semiconductor substrate according to the invention is desirably provided with a hexagonal system C-face, especially III-group face, on a low index surface closest to the substrate surface. The C-face of III-V group nitride system semiconductor crystal has an intense polarity, and the C-face substrate is alternatively provided with III-group face or V-group face on the upper and lower surfaces. The reason why the III-group face is selected for the upper surface is that the III-group face is chemically, mechanically and thermally more stable than the V-group face, and it allows a high yield in epi-growth and in the subsequent device fabrication process. Furthermore, if the upper surface is provided with III-group face, the lower surface is automatically to be provided with V-group face. Thus, the lower surface provided with V-group face can be easily polished in such a case that an underlying substrate is finally thinned to complete a device as in the manufacturing process of LED chip and LD chip.

A III-V group nitride system semiconductor substrate according to the invention is desirably mirror-finished by polishing. This is because, when a substrate with uneven surface is used to grow an epi-layer thereon, even if it is an ideal crystal substrate with no inclination of crystal axis, a resulting surface of the epi-layer will be uneven because of being influenced by the uneven surface of underlying substrate. The uneven surface causes a significant reduction in device yield in the process of fabricating a device, especially in the photolithography process.

A III-V group nitride system semiconductor substrate according to the invention is desirably a self-standing substrate that is obtained by growing hetero-epitaxially a III-V group nitride system semiconductor crystal on a hetero-substrate and then removing the underlying substrate by some method. This is because a crystal with a large diameter and a sufficient thickness can be obtained thereby, as compared to a substrate obtained by the other substrate manufacturing method such as sublimation method and flux method.

A III-V group nitride system semiconductor substrate according to the invention is desirably obtained by polishing a substrate with concave-bowing on the upper surface side to be flattened. Even when a substrate is provided with a concave-bowing on the upper surface side, the inclination orientation of crystal axis is not always directed to inside the substrate. For example, when the thickness of substrate before polishing is distributed such that its center portion is thinner than its circumference, even if the inclination orientation of crystal axis is directed to outside the substrate, the substrate may appear such that it is concave on the upper surface side. However, in a crystal grown with a nearly even thickness, the direction of bowing coincides with the inclination orientation of crystal axis. In this case, the substrate with concave bowing on the upper surface side allows the inclination orientation of crystal axis to be directed to inside the substrate.

A III-V group nitride system semiconductor substrate according to the invention is desirably provided with its lower (back) surface that is flattened by polishing as well as the upper surface. In general, some GaN system self-standing substrates are obtained by separating it from an underlying hetero-substrate by some method after being hetero-epitaxially grown on the underlying hetero-substrate. Therefore, the back surface of separated substrate frequently has a rough surface like a frosted glass or part of underlying substrate attached thereto. Further, it is frequently not flat due to a bowing of substrate. These cause nonuniformity in substrate temperature distribution during the epitaxial growth process. As a result, the uniformity and reproducibility of epi-layer will degrade.

A III-V group nitride system semiconductor substrate according to the invention is desirably provided with a crystalline layer including a layer represented by $Al_xGa_{1-x}N$ ($0<x\leq 1$), the crystalline layer being epitaxially grown on the III-V group nitride system semiconductor substrate. This is because, especially when a mixed crystal of $Al_xGa_{1-x}N$ ($0<x\leq 1$) is epitaxially grown thereon, the epitaxial layer can have an high crystalline quality. It is desirable that the III-V group nitride system semiconductor substrate is grown by MOVPE (metal organic vapor phase epitaxy) or MBE (molecular beam epitaxy) for templates and HVPE (hydride vapor phase epitaxy) for self-standing substrates. The reason why HVPE is used for self-standing substrates is that its crystal growth rate is high and suitable for substrate fabrication.

The inclination orientation of crystal axis in the plane of substrate can be measured by X-ray diffraction measurement. In detail, an X-ray diffraction peak is measured while rotating a crystal around an axis perpendicular to its diffraction surface. If the crystal axis is inclined, it is observed that the peak position is shifted. By finding which direction of crystal the diffraction peak is shifted maximally, the inclination direction of crystal axis can be determined. Further, by measuring the inclination of crystal axis at multiple points in the plane of substrate, the distribution of inclination can be easily determined.

The mechanism is unknown that an AlGaN crystal with a high crystalline quality can be grown on a substrate where the in-plane distribution in inclination orientation of crystal axis nearly perpendicular to the crystal surface is directed to a specific point or region inside or outside the substrate plane. However, it is assumed that the lattice constant of substrate is more narrowed on the substrate surface side in view of the fact that the in-plane distribution in inclination orientation of crystal axis nearly perpendicular to the crystal surface is directed to a specific point or region inside or outside the substrate plane. Thus, a model can be estimated that the narrowed lattice constant is suitable for the epitaxial growth of AlGaN with a lattice constant smaller than GaN. Furthermore, the fact that the AlGaN crystal has a linear expansion coefficient lower than GaN is also likely to be related thereto.

EXAMPLE 1

By using the VAS method, a self-standing substrate is manufactured. The manufacturing steps and conditions are as follows.

A 300 nm undoped GaN layer is grown on a commercially-available single-crystal sapphire C-face substrate with a diameter of 2 inches φ by MOVPE while using TMG and NH₃ as raw materials. The growth pressure is atmospheric pressure, the initial substrate temperature in low-temperature buffer layer growth is 600° C., and the subsequent substrate temperature in GaN epitaxial layer growth is increased to 1100° C. The carrier gas is mixed gas of hydrogen and nitrogen. The crystal growth rate is 4 μm/h. In this process, 20 GaN templates with the GaN epitaxial layer formed on the sapphire substrate are prepared.

Then, a 20 nm metal Ti film is deposited on the GaN epitaxial layer of each GaN template by using an EB deposition apparatus. Then, it is, in an electric furnace, thermally treated for 20 min. in H₂ flow with 20% NH₃ mixed therein while varying temperature from 950 to 1050° C. Thereby, the metal Ti film is changed into mesh-like TiN film and a number of voids are formed in the GaN layer. The temperature of Ti thermal treatment is intentionally varied to control the density of voids formed in the GaN layer. In general, as the temperature of thermal treatment lowers, the density of voids formed tends to decrease. Therefore, in order to increase the density of voids formed in the GaN layer, the temperature of thermal treatment is to be raised to about 1050° C.

Then, the GaN template with the GaN layer with the voids formed thereon is entered in an HVPE furnace, and 550 μm GaN is deposited thereon using the GaN template as an underlying substrate. In the HVPE growth, NH₃ and GaCl are used as raw materials and N₂ is used as carrier gas. The growth pressure is atmospheric pressure, and the substrate temperature is 1040° C. In the cooling process after the completion of growth, the GaN layer is separated at the void layer from the sapphire substrate. Thus, the self-standing GaN substrate with (0001) Ga face at the surface is obtained.

The GaN layer grown on the GaN template with a low density of voids is generally difficult to separate. Thus, even when the substrate after the GaN growth is taken out from the furnace, the GaN layer is still attached onto the sapphire substrate. The GaN layer being attached onto the sapphire substrate is placed on a hotplate heated to 400° C., being subjected to several heat cycles where it is quickly heated from room temperature to 400° C. and then cooled repeatedly. Thereby, only the GaN layer is separated from the sapphire substrate. The self-standing GaN substrate thus obtained has a tendency that it is convex upward-bowed when being laid with the surface turned upward.

On the other hand, The GaN layer grown on the GaN template with a high density of voids is subjected to the separation that proceeds partway even in the process of growth. In the cooling process after the completion of growth, it is perfectly separated at the void layer from the sapphire substrate, and therefore, the GaN layer can be taken out of the furnace while being perfectly separated from the sapphire substrate. The self-standing GaN substrate thus obtained has a tendency that it is convex downward-bowed, in other words, concave upward-bowed, when being laid with the surface turned upward.

By the above process, the nine convex upward-bowed GaN substrates and the eleven convex downward-bowed GaN substrates are obtained.

Then, the GaN substrates obtained are mirror-finished at its upper and lower surfaces by polishing to have finally a thickness of 350 μm. The twenty GaN substrates are all transparent and with a flat mirror surface, and they have a surface roughness Ra of 10 nm or less in scanning a range of 500 μm thereof by a surface profiler.

With the GaN substrates thus fabricated, the X-ray diffraction measurement is conducted to determine the C-axis inclination direction to the surface. The measurement is conducted such that matrix-like 25 points in total are defined at intervals of 7 mm from the center of substrate as a base point in the directions of parallel and vertical to <1-101> direction of substrate, and it is determined what distribution the C-axis inclination direction, which means a direction of a vector made by projecting on the substrate surface a C-axis inclination vector measured at each point, has in the plane of substrate. As a result, the nine GaN substrates that are convex downward-bowed when being laid with the surface turned upward have such a distribution that, as shown in FIG. 3, the inclination direction is radiated toward the outside the substrate, while the amount of C-axis inclination is dispersed. On the other hand, the eleven GaN substrates with convex downward-bowed have such a distribution that, as shown in FIG. 7, the inclination direction is converged on a specific region inside the substrate.

Then, 2 μm Si-doped GaN layer is grown on the twenty self-standing substrates by MOVPE. Further, 0.2 μm Si-doped AlGaN mixed-crystal layer with Al content of x=0.1 is continuously grown thereon in the same furnace. The growth pressure is atmospheric pressure, and the substrate temperature in the growth is 1100° C. In the former growth, TMG is used as III group source material, NH₃ is used as V group source material, and monosilane is used as a dopant. The carrier gas used is mixed gas of hydrogen and nitrogen. The crystal growth rate is 4 μm/h, and the carrier concentration of epi-layer is $2 \times 10^{18}/cm^3$. In the latter growth, the AlGaN layer is grown at the same growth pressure, substrate temperature as the GaN layer. TMG and TMA are used as III group source material, NH₃ is used as V group source material, and monosilane is used as a dopant. The carrier gas used is mixed gas of hydrogen and nitrogen. The crystal growth rate is 0.5 μm/h, and the carrier concentration of epi-layer is $2 \times 10^{18}/cm^3$.

The surface of the twenty epitaxial wafers is observed using a Nomarski microscope so as to determine the existence of a crack. Further, the Ra value is measured scanning a region of 500 μm at five points in the plane of substrate by surface profiler (DEKTAK II). The results are shown in Table 1.

TABLE 1

Evaluation results of epitaxial wafer surface

| | Crack generation ratio | Average Ra value (500 μm scan) |
|---|---|---|
| (a) comparative example | 8/9 = 89% | 476 Å |
| (b) invention example | 0/11 = 0% | 75 Å |

In table 1, example (a) is the epitaxial layer on the nine GaN substrates that the C-axis inclination direction is distributed toward the outside of the substrate, and example (b) is the epitaxial layer on the eleven GaN substrates that the C-axis inclination direction is distributed toward the inside of the substrate. The crack generation ratio is obtained by dividing the number of wafer with a crack by the total number of wafers in example (a) or (b), where the crack generation is determined by observing the entire surface of epitaxial wafer by the microscope with a field of 200 times, and the Ra value is obtained by further averaging the average value of in-plane five points by the number of wafers in example (a) or (b).

Meanwhile, in a substrate with a crack generated, the Ra value is measured except for a portion with the crack generated.

In view of the above results, it is proved that, by using a substrate that the C-axis inclination direction is distributed toward inside the substrate, the AlGaN mixed crystal can be epitaxially grown with a flat surface and without generating any crack.

The self-standing GaN substrate that is convex downward-bowed, in other words, concave upward-bowed, when being laid with the surface turned upward can be obtained by growing the GaN layer on the GaN template with a high density of voids. As described earlier, such a high density of voids can be obtained by raising the temperature of thermal treatment to be about 1050° C.

EXAMPLE 2

A 300 nm undoped GaN layer is grown on a commercially-available single-crystal sapphire C-face substrate with a diameter of 2 inches φ by MOVPE while using TMG and $NH_3$ as raw materials. The sapphire substrate has a surface orientation with 0.2° off-oriented in the m-axis direction. The growth pressure in MOVPE is atmospheric pressure, the initial substrate temperature in low-temperature buffer layer growth is 600° C., and the subsequent substrate temperature in GaN epitaxial layer growth is increased to 1100° C. The carrier gas is mixed gas of hydrogen and nitrogen. The crystal growth rate is 4 μm/h. In this process, 10 GaN templates with the GaN epitaxial layer formed on the sapphire substrate are prepared.

Then, a 20 nm metal Ti film is deposited on the GaN epitaxial layer of each GaN template by using the EB deposition apparatus. Then, it is, in the electric furnace, thermally treated for 20 min. in $H_2$ flow with 20% $NH_3$ mixed therein at 1050° C. Thereby, the metal Ti film is changed into mesh-like TiN film and a number of voids are formed in the GaN layer.

Then, the GaN template with the GaN layer with the voids formed thereon is entered in the HVPE furnace, and 650 μm GaN is deposited thereon using the GaN template as an underlying substrate. In the HVPE growth, $NH_3$ and GaCl are used as raw materials and $N_2$ is used as carrier gas. The growth pressure is atmospheric pressure, and the substrate temperature is 1050° C. In the cooling process after the completion of growth, the GaN layer is naturally separated at the void layer from the sapphire substrate. Thus, the self-standing GaN substrate with (0001) Ga face at the surface is obtained.

Then, the GaN substrates obtained are mirror-finished at its upper and lower surfaces by polishing to have finally a thickness of 430 μm. The ten GaN substrates are all transparent and with a flat mirror surface, and they have a surface roughness Ra of 10 nm or less in scanning a range of 500 μm thereof by the surface profiler.

With the GaN substrates thus fabricated, the X-ray diffraction measurement is conducted to determine the C-axis inclination direction to the surface. The measurement is conducted such that matrix-like 25 points in total are defined at intervals of 7 mm from the center of substrate as a base point in the directions of parallel and vertical to <1-101> direction of substrate, and it is determined what distribution the C-axis inclination direction, which means a direction of a vector made by projecting on the substrate surface a C-axis inclination vector measured at each point, has in the plane of substrate. As a result, all of the ten GaN substrates have such a distribution that, as shown in FIG. 7, the inclination direction is converged on a specific region inside the substrate.

On the other hand, when the dislocation density of self-standing GaN substrate fabricated on the same conditions is measured, it is measured that the entire in-plane region of the substrate is uniformly with such a low dislocation density that the distribution at in-plane nine points of substrate is $2\pm0.6\times10^6/cm^2$. Thus, it is confirmed that the definition of distribution in crystal axis according to the invention is not a factor to degrade the dislocation (defect) density of GaN substrate.

Figure 10:
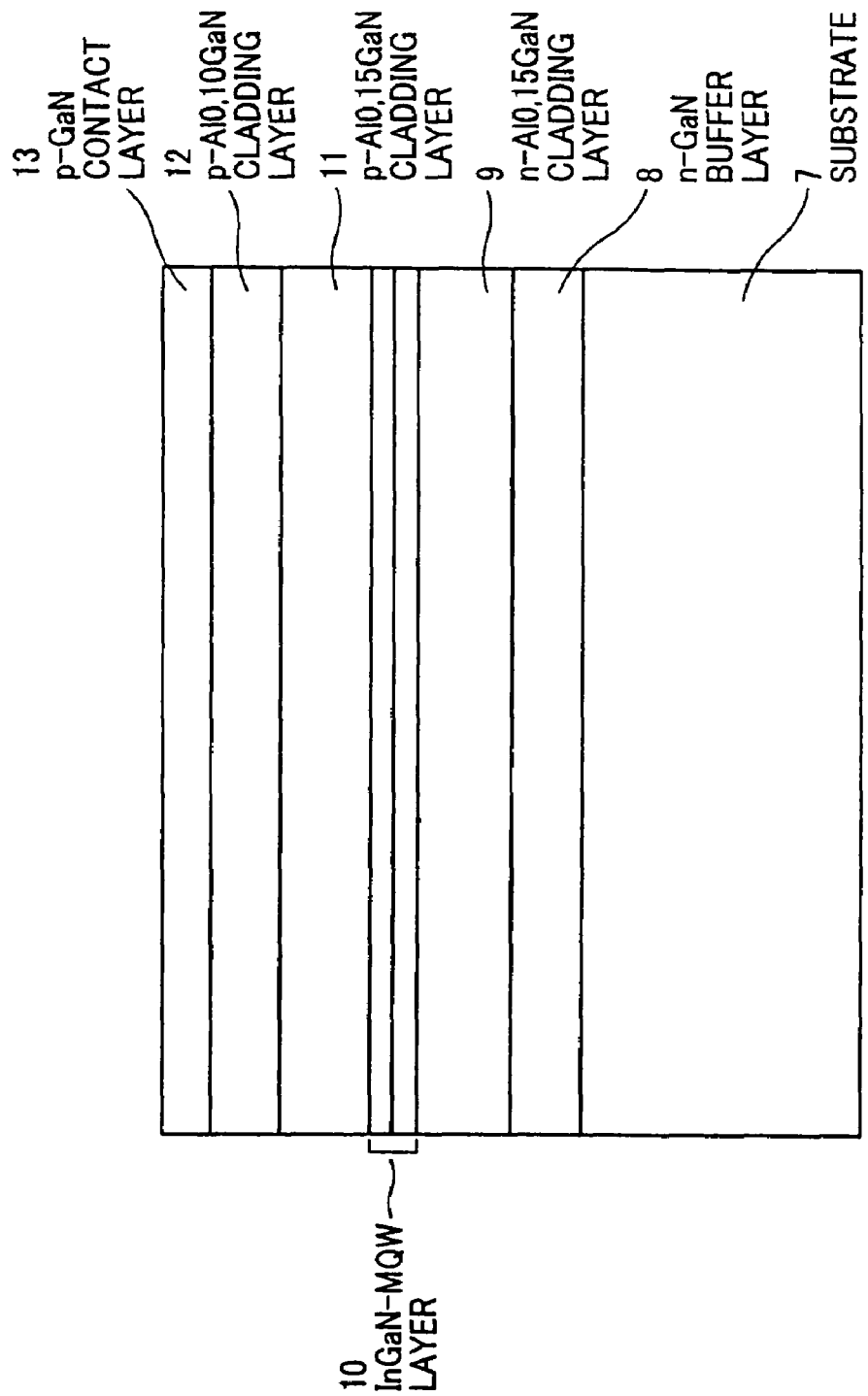
FIG. 10 is a schematic cross sectional view showing an LED epitaxial wafer in a preferred embodiment of the invention, the LED epitaxial wafer including LED structure epitaxial growth layers, which are composed of $Al_xGa_{1-x}N$ ($0<x\leqq1$) formed on a self-standing substrate.

On this substrate, by reduced-pressure MOVPE, an LED epitaxial layer with a structure as shown in FIG. 10 is grown. The layers grown are, sequentially from the substrate 7 side, a Si-doped n-type GaN buffer layer 8, a Si-doped n-type $Al_{0.15}$GaN cladding layer 9, three-cycle InGaN-MQW layer 10, a Mg-doped p-type $Al_{0.15}$GaN cladding layer 11, a Mg-doped p-type $Al_{0.10}$GaN cladding layer 12, and a Mg-doped p-type contact layer 13.

The ten GaN substrates are all provided with the same LED-structure epitaxial layer grown thereon to compose an LED epitaxial wafer, whose surface is observed using the Nomarski microscope so as to determine the existence of a crack. Further, the Ra value is measured scanning a region of 500 μm at five points in the plane of substrate by surface profiler (DEKTAK II). As a result, none of the LED epitaxial wafers is subjected to the generation of crack observed in epitaxial layer. Further, it is proved that the surface roughness of epitaxial layer in the ten LED epitaxial wafers is at most 200 Å or less, and therefore, the wafers are provided with a flatness sufficient to be applied to the device fabrication process.

Then, the LED epitaxial wafers are provided with electrodes, then being diced into a size of 300 μm square by a dicer to obtain an LED chip. The n-electrode is of Ti/Au attached to the back surface of GaN substrate 7. The p-electrode is a Ni/Au transparent electrode attached to the surface of LED epitaxial layer.

The LED chip thus fabricated is with an emission wavelength of 380 nm, and, as the result of continuous application of current at room temperature, an average emission output of 0.9 mW is obtained at 50 mA. In each of the LED epitaxial wafers, the yield of a good chip is always greater than 85%. Thus, it is confirmed that the LED chip can be obtained at a very high yield.

EXAMPLE 3

By the same process as Example 2, GaN self-standing substrates are prepared. Example 3 is different from Example 2 in that a sapphire substrate thereof has a surface orientation with 0.5° off-oriented in the m-axis direction.

Then, the GaN substrates obtained are, as in Example 2, mirror-finished at its upper and lower surfaces by polishing to have finally a thickness of 430 μm. The GaN substrates after the polishing are all transparent and with a flat mirror surface, and they have a surface roughness Ra of 10 nm or less in scanning a range of 500 μm thereof by the surface profiler.

With the GaN substrates thus fabricated, the C-axis inclination direction to the surface is measured by the same method as the abovementioned. As a result, the GaN substrates have such a distribution that, as shown in FIGS. 8 and 9, the inclination direction is converged on a specific point or region outside the substrate.

Then, the same LED structure as in Example 2 is fabricated on the GaN self-standing substrate obtained in Example 3, and its property and good-chip yield is researched. As a result, it is proved that the good-chip yield of Example 3 is equivalent to or a little higher than that in Example 2 where the LED structure is fabricated by using the substrate that the inclination direction is converged on a specific point or region inside the substrate.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the GaN crystal may be grown by MBE, LPE (liquid phase epitaxy), sublimation etc.

Although in the above embodiments the sapphire substrate is used as the underlying substrate to fabricate the III-V group nitride system semiconductor substrate of the invention, all conventionally known substrates, such as GaAs, Si, $ZrB_2$ and ZnO, to be used as a GaN system epitaxial layer can be applied thereto.

Although in the above embodiments the self-standing GaN substrates are exemplified, the invention can be applied to a self-standing AlN and AlGaN substrate.

What is claimed is:

1. A III-V group nitride system semiconductor substrate, comprising a III-V group nitride system single crystal, wherein:
    a vector made by projecting on a surface of the substrate a normal vector of a low index surface closest to the substrate surface at an arbitrary point in a plane of the substrate is converged on a specific point or a specific region outside the substrate; and
    the III-V group nitride system semiconductor substrate surface comprises a flat surface.

2. The III-V group nitride system semiconductor substrate according to claim 1, wherein:
    the substrate comprises a self-standing substrate consisting of the III-V group nitride system single crystal.

3. The III-V group nitride system semiconductor substrate according to claim 1, wherein:
    the III-V group nitride system single crystal is of hexagonal system.

4. The III-V group nitride system semiconductor substrate according to claim 1, wherein:
    the III-V group nitride system single crystal is of hexagonal system and the low index surface comprises a C-face.

5. The III-V group nitride system semiconductor substrate according to claim 1, wherein:
    the III-V group nitride system single crystal is of hexagonal system and the low index surface comprises a III-group C-face.

6. The III-V group nitride system semiconductor substrate according to claim 1, wherein:
    the III-V group nitride system single crystal is of hexagonal system and the low index surface comprises an A-face, M-face or R-face.

7. The III-V group nitride system semiconductor substrate according to claim 1, wherein:
    the substrate comprises a surface mirror-finished by polishing.

8. A method of making a III-V group nitride system semiconductor substrate, comprising a III-V group nitride system single crystal, wherein: a vector made by projecting on a surface of the substrate a normal vector of a low index surface closest to the substrate surface at an arbitrary point in a plane of the substrate is converged on a specific point or a specific region outside the substrate; and the III-V group nitride system semiconductor substrate surface comprises a flat surface, comprising:
    hetero-epitaxially growing the III-V group nitride system single crystal on a hetero-substrate; and
    subsequently removing the hetero-substrate to obtain the III-V group nitride system semiconductor substrate.

9. A method of making a III-V group nitride system semiconductor substrate, comprising a III-V group nitride system single crystal, wherein: a vector made by projecting on a surface of the substrate a normal vector of a low index surface closest to the substrate surface at an arbitrary point in a plane of the substrate is converged on a specific point or a specific region outside the substrate; and the III-V group nitride system semiconductor substrate comprises a flat surface; comprising:
    polishing an upper surface of a substrate, the upper surface being of a III-V group nitride system single crystal and being concave upward-bowed, thereby obtaining the III-V group nitride system semiconductor substrate.

10. A III-V group nitride system semiconductor substrate, comprising:
    a first III-V group nitride system semiconductor substrate, comprising a III-V group nitride system single crystal, wherein: a vector made by projecting on a surface of the substrate a normal vector of a low index surface closest to the substrate surface at an arbitrary point in a plane of the substrate is converged on a specific point or a specific region outside the substrate; and the first III-V group nitride system semiconductor substrate surface comprises a flat surface; and
    a crystal layer that is formed on the first III-V group nitride system semiconductor substrate, and comprises a layer represented by $Al_xGa_{1-x}N$ ($0<x\leq1$).

11. A III-V group nitride system semiconductor device, comprising:
    a III-V group nitride system semiconductor substrate, comprising a III-V group nitride system single crystal, wherein: a vector made by projecting on a surface of the substrate a normal vector of a low index surface closest to the substrate surface at an arbitrary point in a plane of the substrate is converged on a specific point or a specific region outside the substrate; and the III-V group nitride system semiconductor substrate surface comprises a flat surface; and
    a plurality of crystal layers that are formed on the III-V group nitride system semiconductor substrate, and comprise a layer represented by $Al_xGa_{1-x}N$ ($0<x\leq1$).

12. A lot of LIT-V group nitride system semiconductor substrate, comprising a plurality of III-V group nitride system semiconductor substrates,
    wherein: each of the plurality of III-V group nitride system semiconductor substrates comprises a III-V group nitride system single crystal, wherein: a vector made by projecting on a surface of the substrate a normal vector of a low index surface closest to the substrate surface at an arbitrary point in a plane of the substrate is converged on a specific point or a specific region outside the substrate; and the each III-V group nitride system semiconductor substrate surface comprises a flat surface.

* * * * *